(12) United States Patent
Liang et al.

(10) Patent No.: US 7,907,023 B2
(45) Date of Patent: Mar. 15, 2011

(54) PHASE LOCK LOOP WITH A MULTIPHASE OSCILLATOR

(75) Inventors: Paul Cheng-Po Liang, Santa Clara, CA (US); Koji Takinami, Saratoga, CA (US)

(73) Assignee: Panasonic Corporation, Osaka (JP)

( * ) Notice: Subject to any disclaimer, the term of this patent is extended or adjusted under 35 U.S.C. 154(b) by 68 days.

(21) Appl. No.: 12/475,211

(22) Filed: May 29, 2009

(65) Prior Publication Data

US 2010/0301953 A1     Dec. 2, 2010

(51) Int. Cl.
*H03L 7/099* (2006.01)
(52) U.S. Cl. ............................ 331/45; 331/16
(58) Field of Classification Search .................... 331/45, 331/16
See application file for complete search history.

(56) References Cited

U.S. PATENT DOCUMENTS

| | | |
|---|---|---|
| 4,879,527 A | 11/1989 | Geile et al. |
| 6,326,851 B1 | 12/2001 | Staszewski et al. |
| 6,933,791 B2 * | 8/2005 | Chen .............................. 331/45 |
| 6,967,992 B1 | 11/2005 | Rabaeijs et al. |
| 7,209,065 B2 | 4/2007 | Wood |
| 7,236,060 B2 | 6/2007 | Wood |
| 2005/0251775 A1 | 11/2005 | Wood |
| 2008/0265998 A1 | 10/2008 | Wood |

OTHER PUBLICATIONS

Savoj, et al. "A 10-Gb/s CMOS clock and Data Recovery Circuit With a Half-Rate Binary Phase/Frequency Detector", IEEE Journal of Solid-State Circuits vol. 38 No. 1, Jan. 2003, pp. 13-21.

* cited by examiner

*Primary Examiner* — Joseph Chang

(57) ABSTRACT

A phase lock loop utilizes a multiphase oscillator having a plurality of digital inputs. A plurality of DQ flip-flops, offset in time from each other generate a plurality of control signals to remove control phase information from the oscillator in digital form. A DQ flip-flop connected between any two digital inputs on the oscillator determines direction of the traveling wave. The direction and phase information address a look-up table to determine the current fractional phase of the oscillator. A divide by N circuit is used to reduce the oscillator frequency. A total phase indicator signal for the oscillator is determined using the current fractional phase. The total phase is compared to a reference phase to produce a control signal for making adjustments to the oscillator. In a feed-forward path, frequency dividers divide a high frequency signal from the oscillator to a lower desired frequency, thereby increasing phase resolution.

32 Claims, 8 Drawing Sheets

| Phase (deg) / Tap | 0 – 22.5 | 22.5 – 45 | 45 – 67.5 | 67.5 – 90 | 90 – 112.5 | 112.5 – 135 | 135 – 157.5 | 157.5 – 180 | 180 – 202.5 | 202.5 – 225 | 225 – 247.5 | 247.5 – 270 | 270 – 292.5 | 292.5 – 315 | 315 – 337.5 | 337.5 |
|---|---|---|---|---|---|---|---|---|---|---|---|---|---|---|---|---|
| P(1) | 1 | 1 | 1 | 1 | 1 | 1 | 1 | 1 | 0 | 0 | 0 | 0 | 0 | 0 | 0 | 0 |
| P(2) | 0 | 1 | 1 | 1 | 1 | 1 | 1 | 1 | 1 | 0 | 0 | 0 | 0 | 0 | 0 | 0 |
| P(3) | 0 | 0 | 1 | 1 | 1 | 1 | 1 | 1 | 1 | 1 | 0 | 0 | 0 | 0 | 0 | 0 |
| P(4) | 0 | 0 | 1 | 1 | 1 | 1 | 1 | 1 | 1 | 1 | 1 | 0 | 0 | 0 | 0 | 0 |
| P(5) | 0 | 0 | 0 | 0 | 1 | 1 | 1 | 1 | 1 | 1 | 1 | 1 | 0 | 0 | 0 | 0 |
| P(6) | 0 | 0 | 0 | 0 | 0 | 1 | 1 | 1 | 1 | 1 | 1 | 1 | 1 | 0 | 0 | 0 |
| P(7) | 0 | 0 | 0 | 0 | 0 | 0 | 1 | 1 | 1 | 1 | 1 | 1 | 1 | 1 | 0 | 0 |
| P(8) | 0 | 0 | 0 | 0 | 0 | 0 | 0 | 1 | 1 | 1 | 1 | 1 | 1 | 1 | 1 | 0 |

FIGURE 13

| Phase (deg) / Tap | 0 – 22.5 | 22.5 – 45 | 45 – 67.5 | 67.5 – 90 | 90 – 112.5 | 112.5 – 135 | 135 – 157.5 | 157.5 – 180 | 180 – 202.5 | 202.5 – 225 | 225 – 247.5 | 247.5 – 270 | 270 – 292.5 | 292.5 – 315 | 315 – 337.5 | 337.5 |
|---|---|---|---|---|---|---|---|---|---|---|---|---|---|---|---|---|
| P(1) | 1 | 0 | 0 | 0 | 0 | 0 | 0 | 0 | 0 | 1 | 1 | 1 | 1 | 1 | 1 | 0 |
| P(2) | 0 | 0 | 0 | 0 | 0 | 0 | 0 | 0 | 1 | 1 | 1 | 1 | 1 | 1 | 1 | 1 |
| P(3) | 0 | 0 | 0 | 0 | 0 | 0 | 1 | 1 | 1 | 1 | 1 | 1 | 1 | 1 | 1 | 1 |
| P(4) | 0 | 0 | 0 | 0 | 1 | 1 | 1 | 1 | 1 | 1 | 1 | 1 | 1 | 0 | 0 | 0 |
| P(5) | 0 | 0 | 0 | 1 | 1 | 1 | 1 | 1 | 1 | 1 | 1 | 1 | 0 | 0 | 0 | 0 |
| P(6) | 0 | 0 | 1 | 1 | 1 | 1 | 1 | 1 | 1 | 1 | 1 | 0 | 0 | 0 | 0 | 0 |
| P(7) | 0 | 0 | 1 | 1 | 1 | 1 | 1 | 1 | 1 | 1 | 0 | 0 | 0 | 0 | 0 | 0 |
| P(8) | 0 | 0 | 1 | 1 | 0 | 0 | 0 | 0 | 1 | 0 | 0 | 0 | 0 | 0 | 0 | 0 |

FIGURE 14

PHASE LOCK LOOP WITH A MULTIPHASE OSCILLATOR

BACKGROUND OF THE INVENTION

1. Field of the Invention

The present invention relates to phase lock loops, and specifically to phase lock loops using multiphase oscillators.

2. Description of Related Art

Prior art techniques for phase determination in a phase lock loop are often difficult, resource intensive, and not accurate enough. One such prior art system, disclosed in Staszewski et al. (U.S. Pat. No. 6,326,851), determines a digital fractional phase by passing a clock signal from a 2.4 GHz voltage controlled oscillator through a chain of inverters. Each inverter produces a clock pulse slightly delayed from the immediately previous inverter. The resulting staggered clock phases are then sampled by a reference clock. The delay of inverters are sensitive to process and temperature variations and is limited to a time resolution of 20 ps based on the state of the technology. Since the phase resolution is dependent on the timing resolution, the phase resolution is also limited.

There is an unsolved need for a phase lock loop that has more accurate phase resolution.

SUMMARY OF THE INVENTION

The phase lock loop of the present invention includes a multiphase oscillator such as a rotary traveling wave oscillator having a plurality of digital inputs, but instead of one DQ flip-flop, a plurality of DQ flip-flops is used to clock the digital inputs. The plurality of DQ flip-flops are offset in time from each other and drive the oscillator to generate a plurality of multiphase signals. The plurality of DQ flip-flops activate the plurality of digital inputs in the oscillator at zero crossing points of the traveling wave thereby eliminating perturbations in the phase signals from the oscillator. A DQ flip-flop connected to the oscillator determines direction of travel (clockwise or counterclockwise) of the traveling wave. A look-up table, addressed by multiphase signals from the oscillator and the direction of the traveling wave, determines the current fractional phase of the oscillator. The oscillator allows for higher ring oscillation frequencies, thereby considerably increasing phase resolution. The increased phase resolution is converted to digital form in the feedback path of the phase lock loop, permitting a much finer phase resolution than heretofore possible while at the same time reducing phase quantization noise. In a feed-forward path, frequency dividers divide an output signal of the oscillator to a desired frequency increasing phase resolution in the transmitted signal.

BRIEF DESCRIPTION OF THE DRAWINGS

The exact nature of this invention, as well as the objects and advantages thereof, will become readily apparent from consideration of the following specification in conjunction with the accompanying drawings in which like reference numerals designate like parts throughout the figures thereof and wherein:

FIG. 13 is a look-up table used in the embodiment of FIG. 1;

FIG. 14 is a look-up table used in the embodiment of FIG. 1;

DETAILED DESCRIPTION OF THE PREFERRED EMBODIMENTS

Figure 1:
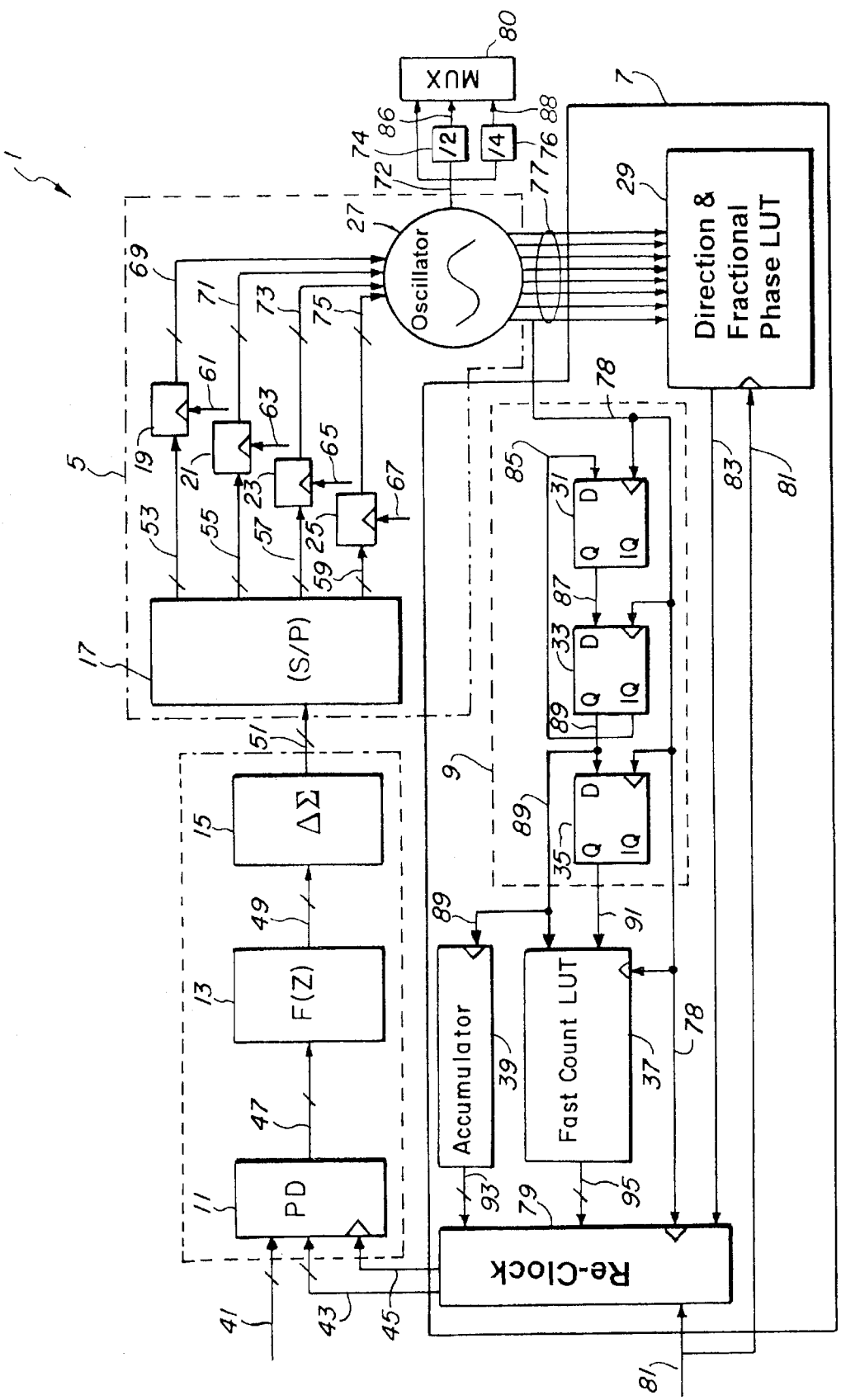
FIG. 1 is a block diagram of a phase lock loop according the present invention.

FIG. 1, shows a phase lock loop according to the present invention. A phase detector 11 receives a reference phase signal 41, a total phase signal 43, and a clock signal 45. The reference phase signal 41 represents a carrier frequency to lock to. The phase detector 11 compares the reference phase signal 41 to the total phase signal 43 upon receipt of the clock signal 45 and generates a control signal 47 which is proportional to the phase difference between the reference phase signal 41 and the total phase signal 43. Ideally the phase difference or error signal is zero.

A filter 13 receives the control signal 47 from the phase detector 11 and averages the control signal 47, generating a filtered control signal 49. A ΔΣ modulator 15 receives the filtered control signal 49 and performs a noise shaping function on the filtered control signal 49. The ΔΣ modulator 15 oversamples the filtered control signal 49 to push any noise within the filtered control signal 49 into a higher frequency range, producing the noise shaped or filtered signal 51. Although a ΔΣ modulator 15 is used, it is contemplated that other types of noise suppression filter could be used.

A serial to parallel converter 17 separates the signal 51 into four separate signals 53, 55, 57, and 59 and slows down the clock speed. For example, if the clock frequency of the signal 51 received by the serial and parallel converter 17 was 400 MHz, then each of the four signals 53, 55, 57 and 59 would have a clock frequency equal to 400 MHz/4 or 100 MHz.

The four signals 53, 55, 57, and 59 are transmitted to respective DQ flip-flops 19, 21, 23, and 25. Although the serial to parallel converter 17 is shown as separating the high frequency signal 51 into four lower frequency signals, the serial to parallel converter 17 could separate the high frequency signal 51 into any convenient number of lower frequency signals.

DQ flip-flops 19, 21, 23, and 25 receive the respective signals 53, 55, 57, and 59, along with respective clock signals 61, 63, 65, and 67 and generate control signals 69, 71, 73, and 75. The control signals 69, 71, 73, and 75 are phase-shifted from each other, according to the clock signals 61, 63, 65, and 67.

Figure 2:
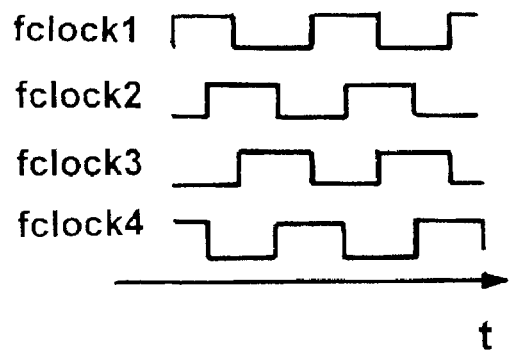
FIG. 2 is a pulse sequence showing clocking signals for the embodiment of FIG. 1.

FIG. 2 illustrates the clock signals 61, 63, 65 and 67. Frequency clock (fclock1) corresponding to the clock signal 61, frequency clock (fclock2) corresponding to clock signal 63, frequency clock (fclock3) corresponding to the clock signal 65, and frequency clock (fclock4) corresponding to the clock signal 67. Each of the clock signals 61, 63, 65, and 67 may be generated by digital inputs within a multiphase oscillator 27, which can be a rotary traveling wave oscillator as shown, or its equivalent. Each of the clock signals 61, 63, 65, and 67 are phase-shifted by different fixed amounts. The control signals 69, 71, 73, and 75 generated by the DQ flip-flops 19, 21, 23 and 25 respectively, are transmitted to various digital inputs on the multiphase oscillator 27, and more specifically to capacitor control circuits (FIGS. 3, 4) used in the multiphase oscillator 27.

Figure 3:
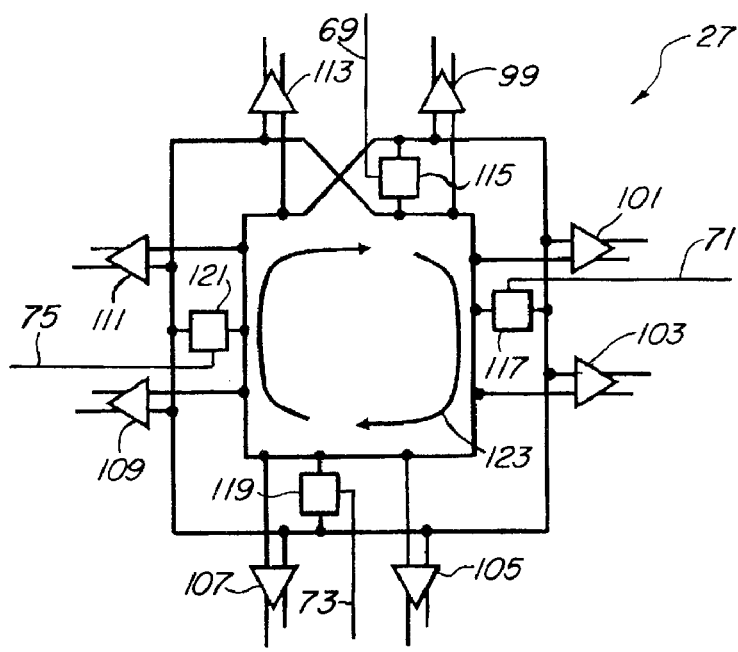
FIG. 3 is a schematic of a rotary traveling wave oscillator.

In FIG. 3, the multiphase oscillator 27 has a traveling wave 123 circling around a loop past eight digital inputs 99, 101, 103, 105, 107, 109, 111, and 113. Although the traveling wave 123 is shown circulating in a clockwise direction, it could also be circulating in a counterclockwise direction. The four clock signals 61, 63, 65, and 67 are signals from four of the eight digital inputs 99, 101, 103, 105, 107, 109, 111 and 113. For example, clock signal 61 could be from digital input 99, clock signal 63 could be from digital input 103, clock signal 65 could be from digital input 107, and clock signal 67 could be from digital input 111.

Figure 5:
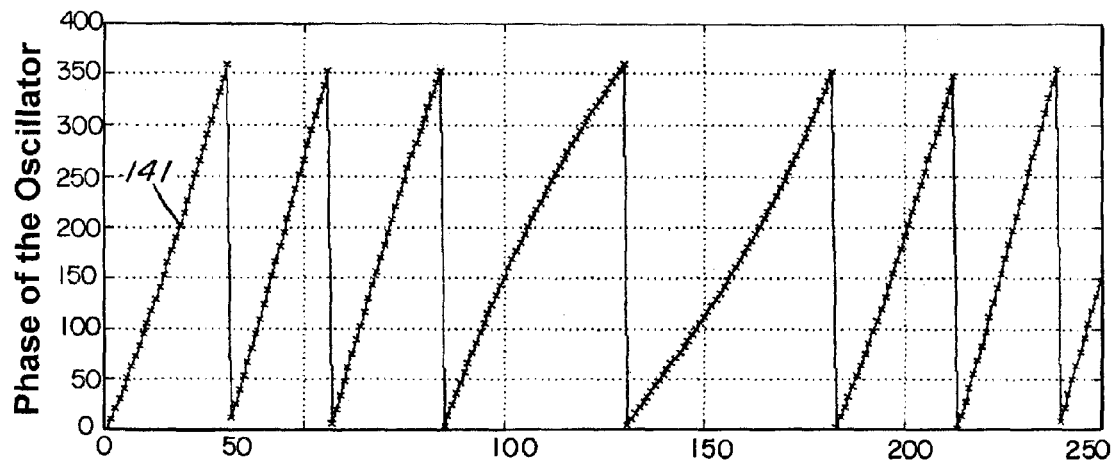
FIG. 5 is a graph of the phase signals of a rotary traveling wave oscillator.
Figure 6:
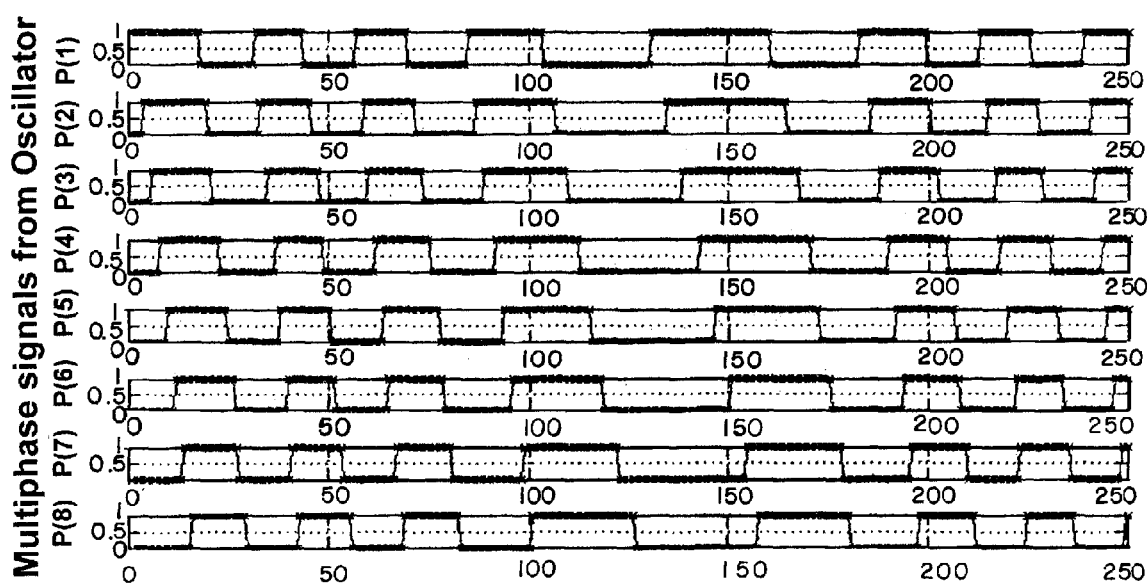
FIG. 6 is a plurality of pulse sequences representing multiple phase signals from a rotary traveling wave oscillator.

As the traveling wave 123 circulates around the loop, each digital input in the loop of the multiphase oscillator 27 produces a phase signal. A complete circumvention of the loop by the traveling wave represents a 180° phase change. Two complete rotations represent a 360° phase change. For example, if a digital input outputs a "1" when a point on a traveling wave passes a first time, the digital input will output a "0" when the same point of the traveling wave passes the digital input a second time. The oscillation 141 of the multiphase oscillator 27 of the present invention is shown in FIG. 5. The pulse outputs from each of the digital inputs P(1) 99, P(2) 101, P(3) 103, P(4) 105, P(5) 107, P(6) 109, P(7) 111, and P(8) 113 is shown in FIG. 6. The phase signals from each digital input are phase-shifted from each other.

Figure 4:
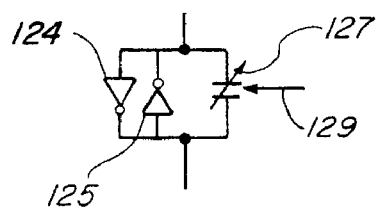
FIG. 4 is a schematic of a variable capacitor circuit used in the rotary traveling wave oscillator of FIG. 3.

Variable capacitor circuits 115, 117, 119, and 121 are connected to the multiphase oscillator 27 (FIG. 3). The capacitor circuits receive control signals 69, 71, 73, and 75 from the lower frequency respective DQ flip-flops 19, 21, 23, and 25. As shown in FIG. 4, each of the variable capacitor circuits 115, 117, 119, and 121 include a first inverter 124, a second inverter 125, and a variable capacitor 127, which consists of a plurality of small varactors connected in parallel. The control signals 69, 71, 73, and 75 trigger the varactors in each of the capacitor circuits 115, 117, 119, and 121. The control signals 69, 71, 73, and 75 turn the varactors on/off and control oscillation frequency of the multiphase oscillator 27.

Figure 7:
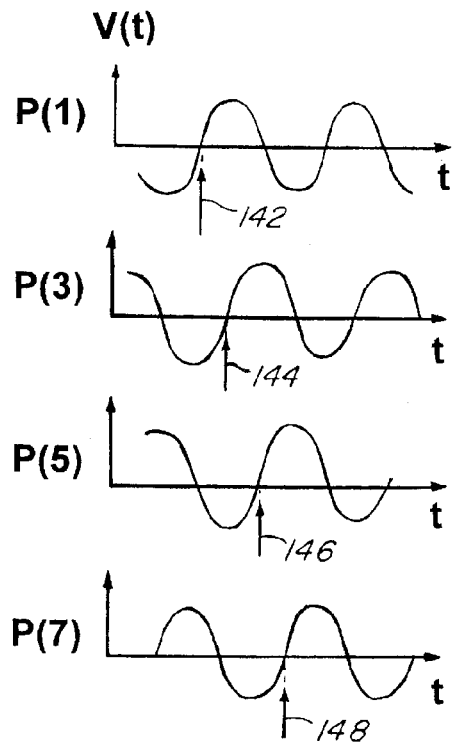
FIG. 7 is a series of waveforms showing the traveling wave at different points in a rotary traveling wave oscillator according to the present invention.

In FIG. 7, by utilizing multiple clock signals 69, 71, 73, 75 (FIG. 1), the timing for switching the variable capacitor circuits 115, 117, 119, and 121 (FIG. 2) can be selected to be at zero crossings 142, 144, 146, and 148 of the travelling wave, as indicated by the waveforms for P(1), P(3), P(5), and P(7), respectively of FIG. 7. By aligning the timing of capacitor switching in this manner, perturbations due to capacitor switching present in prior art devices is eliminated.

Figure 8:
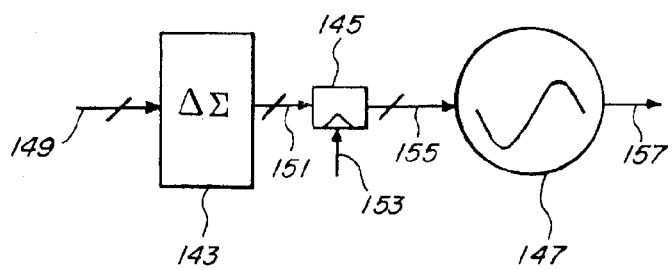
FIG. 8 is a conventional single DQ flip-flop rotary traveling wave oscillator.

A prior art conventional single DQ flip-flop digital controlled oscillator is shown in FIG. 8. It includes a ΔΣ modulator 143, a single DQ flip-flop 145, and a RTWO 147. The ΔΣ modulator 143 receives and shapes a signal 149 to generate a signal 151 which is transmitted to the DQ flip-flop 145. The DQ flip-flop 145 also receives a clock signal 153 which is used, along with the signal 151, to generate control signals 155. The RTWO 147 utilizes the control signals 155 to generate the multiphase signal 157.

Figure 9:
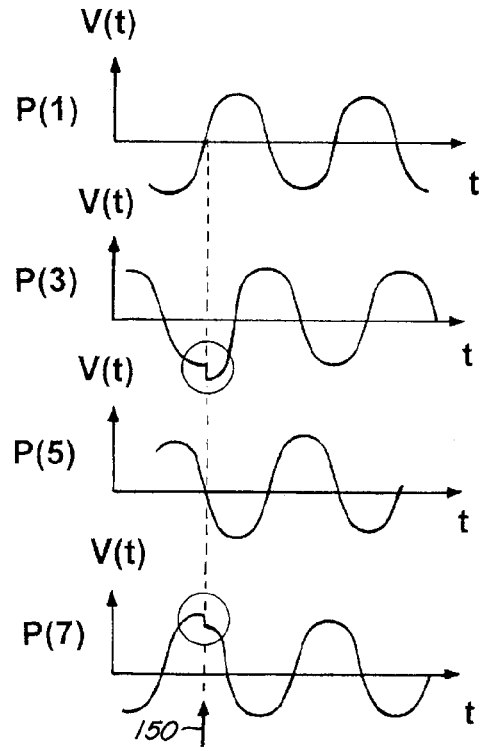
FIG. 9 is a series of waveforms showing the traveling wave at different points in a prior art rotary traveling wave oscillator.

Referring to FIG. 9 and assuming that the RTWO 147 utilizes the same digital input structure as the multiphase oscillator 27 of FIG. 3, the digital inputs 103 and 111, as indicated by the signal wave for P(3) and P(7) will experience large perturbations due to capacitor switching. This is because the single DQ flip-flop switches all digital inputs at the same time, leaving no room for adjustment to match zero crossings of the traveling wave in the RTWO 147. The perturbations created, as shown in FIG. 9, increase phase noise substantially.

Referring again to FIG. 1, the multiphase oscillator 27 transmits an output signal 72 in a feed-forward path to a multiplexer 80, a frequency divider 74 and a frequency divider 76. The output signal 72 is at the operating frequency of the multiphase oscillator 27. If the multiphase oscillator 27 is operating at 4 GHz, then the output signal 72 has a frequency of 4 GHz. Frequency dividers 74 and 76 divide the frequency of the output signal 72 to generate lower frequency signals 86 and 88, respectively, which are transmitted to a multiplexer 80. Frequency divider 74 may divide the frequency of output signal 72 by two, while frequency divider 76 may divide the frequency of output signal 74 by four. Thus, signal 86 has a frequency of 2 GHz while signal 88 has a frequency of 1 GHz. Frequency dividers 74 and 76 are contemplated as capable of dividing the multiphase oscillator frequency by any amount to generate a lower frequency, as required.

The multiplexer 80 selects the output signal 72, the frequency divided signal 86, or the frequency divided signal 88 to send to a transmitter (not shown). The multiplexer 80 selects one of the signals based on the frequency of the signal which is used by the transmitter. For example, if the transmitter is operating in a GSM mode where a 900 MHz frequency is used, the multiplexer 80 selects the frequency divided signal 88. However, if the transmitter is operating in a PCS mode where a 1900 MHz frequency is used, the multiplexer 80 selects the frequency divided signal 86.

The higher the frequency division of the output signal 72, the higher the phase resolution of the resulting lower frequency signal. For example, assume the output signal 72 was at 4 GHz, and the multiphase oscillator 27 had 8 digital inputs, producing 8 phases for every 180 degrees, and 16 phases for every 360 degrees in the output signal 72. The phase resolution would be 360°/(8×2)=22.5 degrees. If the output signal 72 is divided by two to produce signal 86 at a frequency of 2 GHz, there are 16 phases for every 180 degrees, and 32 phases for every 360 degrees. The phase resolution of the frequency divides signal 86 would be 360°/(8×2×2)=11.25 degrees. If the output signal 72 is divided by four to produce the signal 86 at a frequency of 1 GHz, there are 32 phases for every 180 degrees, and 64 phases for every 360 degrees. The phase resolution of frequency divided signal 88 is 360°/(8×2×2×2)= 5.625 degrees. Thus, phase resolution can be improved not only by increasing the number of digital inputs on the multiphase oscillator, but also by frequency division of the multiphase oscillator output signal 72.

Referring now to FIG. 1 and the feedback path 7, a direction determination unit and fractional phase look-up table 29 receives the multiphase signals 77 from the multiphase oscillator 27 along with a clock reference signal 81. The direction determination unit and fractional phase look-up table 29 determines the current fractional phase of the multiphase oscillator 27, at the time indicated by the clock reference signal 81.

The direction of the traveling wave is determined by a DQ flip-flop 131 (FIG. 10) located in the direction determination unit and fractional phase look-up table 29. The DQ flip-flop 131 is connected between any two digital inputs in the multiphase oscillator 27, such as between the P(1) digital input 99 and the P(2) digital input 101 (not shown). The DQ flip-flop 131 receives a signal 133 from the P(1) digital input 99 and a signal 135 from the P(2) digital input 101 and outputs a signal 137.

Figure 11:
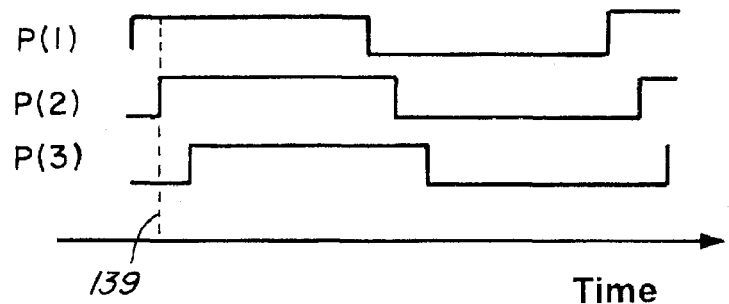
FIG. 11 is a pulse sequence for the flip-flop of FIG. 10.

FIG. 11 shows the pulse signal from P(1) digital input 99, the P(2) digital input 101, and the P(3) digital input 103 when the traveling wave 123 of the multiphase oscillator 27 is circulating in a clockwise direction. As shown, P(1) and P(2) are both high when P(3) is low.

Figure 12:
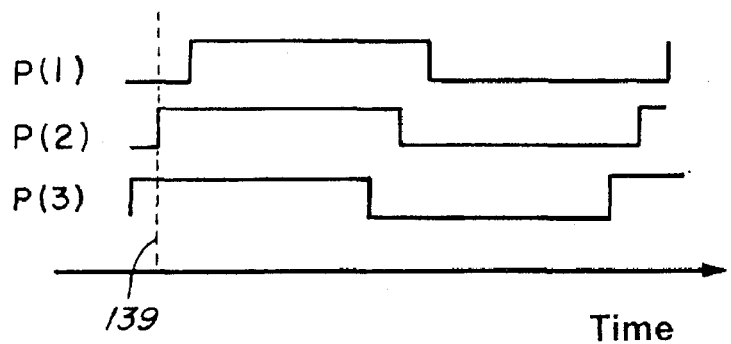
FIG. 12 is a pulse sequence for the flip-flop of FIG. 10.

FIG. 12 shows the pulse signals from the P(1) digital input 99, the P(2) digital input 101, and the P(3) digital input 103 when the traveling wave 123 of the multiphase oscillator 27 is circulating in a counterclockwise direction. In this case P(1) is low and P(2) is high when P(3) is high. In both FIG. 11 and FIG. 12, the signal 133 from the P(1) digital input 99 and the signal 135 from the P(2) digital input 101 can be taken at time 139. The digital value of signal 133 and signal 135 determines the digital output 137 of DQ flip-flop 131. The digital output 137 determines whether the traveling wave is traveling in a clockwise direction or a counterclockwise direction.

At time 139, if the traveling wave is rotating in a clockwise direction, traveling from the digital input 99 to the digital input 101, the output 137 is high or "1." If the traveling wave is rotating in a counterclockwise direction traveling from digital input 101 to digital input 99 at time 139, the output 137 is low or "0."

The direction determination unit and fractional phase look-up table 29 (FIG. 1) also includes a fractional phase look-up table to determine the phase of the traveling wave at any given time. Once direction of the traveling wave has been determined, a clockwise or counterclockwise look-up table is used to determine phase of the traveling wave. For example, if the traveling wave is traveling clockwise, a clockwise fractional phase look-up table, such as shown in FIG. 13, is used. If the traveling wave is traveling counterclockwise, a counterclockwise fractional phase look-up table, such as shown in FIG. 14, is used.

In FIG. 13 and FIG. 14, the eight digital inputs P(1) 99, P(2) 101, P(3) 103, P(4) 105, P(5) 107, P(6) 109, P(7) 111, and P(8) 113 at any given time, determine the current fractional phase of the traveling wave. For example, assuming the traveling wave is rotating clockwise, and the digital inputs are P(1)=1, P(2)=1, P(3)=1, P(4)=0, P(5)=0, P(6)=0, P(7)=0, and P(8)=0, from the clockwise table of FIG. 13, the traveling wave has a current fractional phase between 45 and 67.5 degrees. If the traveling wave is rotating counterclockwise, and the digital inputs are P(1)=1, P(2)=1, P(3)=1, P(4)=0, P(5)=0, P(6)=0, P(7)=0, and P(8)=0, from the counterclockwise table of FIG. 14, the traveling wave has a current fractional phase between 315 and 337.5 degrees.

Figure 10:
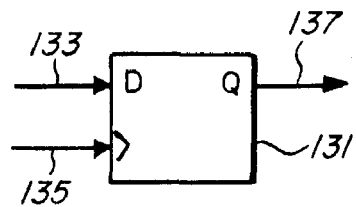
FIG. 10 is a schematic symbol of a DQ flip-flop.

The fractional phase look-up tables of FIG. 13 and FIG. 14 assume that the traveling wave starts at the first digital input 99. However, the traveling wave can start at any digital input and the fractional phase look-up tables will adjust accordingly. The fractional phase look-up tables illustrated contain information for eight digital inputs. However, more digital inputs could be used. If the number of digital inputs in the multiphase oscillator 27 is increased, each phase range is reduced accordingly. The size of each phase range corresponds to 180 degrees divided by the number of digital inputs. In FIG. 9 and FIG. 10, the size of the phase range is 22.5 degrees. If, however, there were 16 digital inputs, then the size of the phase range would be 180 degrees divided by 16, or 11.25 degrees. Increasing the digital inputs increases phase resolution of the multiphase oscillator 27. It is contemplated that 10,000 or more digital inputs could be used in the multiphase oscillator 27. Advantageously, in the present invention the phase resolution is not carrier frequency dependent thereby eliminating the need for a calibration circuit. Furthermore, the phase resolution is not limited by inverter delay.

The current fractional phase value of the traveling wave is determined by the direction determination unit and fractional phase look-up table 29 and is provided as a fractional phase signal 83 to a re-clock unit 79 (FIG. 1).

The phase to digital converter 7 embodiment of the oscillator 27 and the direction and phase determination unit 29 shown in FIG. 1 provide a system that reduces the operational frequency, size, and current consumption. Moreover, design complexity of the phase to digital converter 7 is reduced.

A divide by N circuit 9 (FIG. 1) includes three D flip-flops 31, 33, and 35. The D flip-flop 31 receives one of the multiphase signals 78 from the multiphase oscillator 27 and a feedback signal 85 from the D flip-flop 33. The D flip-flop 31 transmits a signal 87 to the D flip-flop 33. The D flip-flop 33 receives the signal 87 and one of the multiphase signals 78 from the multiphase oscillator 27. The D flip-flop 33 transmits a digital phase indicating signal 89 (D1 of FIG. 15) to the D flip-fop 35, the accumulator 39, and the fast count unit 37. The D flip-flop 35 receives the digital phase indicating signal 89 and one of the multiphase signals 78 (P1 of FIG. 15) from the multiphase oscillator 27 and transmits a digital phase indicating signal 91 (D2 of FIG. 15) to the fast count unit 37. The divide by N circuit 9 may be a divide by 4 circuit. Accordingly, the digital phase indicating signal 89 (D1) is HIGH for two periods and LOW for two periods. The digital phase indicating signal 91 (D2) is HIGH for two periods and LOW for two periods, but is delayed by one period from the digital phase indicating signal 89 (D1). Thus, the digital phase indicating signal 89 (D1) and the digital phase indicating signal 91 (D2) can form N unique combinations, which in this case is four unique combinations of HIGH and LOW signals. For example, the digital phase indicating signal 89 (D1) and the digital phase indicating signal 91 (D2) can have the combinations HIGH-LOW, HIGH-HIGH, LOW-HIGH, and LOW-LOW. The divide by N circuit reduces operational speed of the accumulator 39 by allowing the accumulator 39 to increment every Nth period instead of every period.

Figure 15:
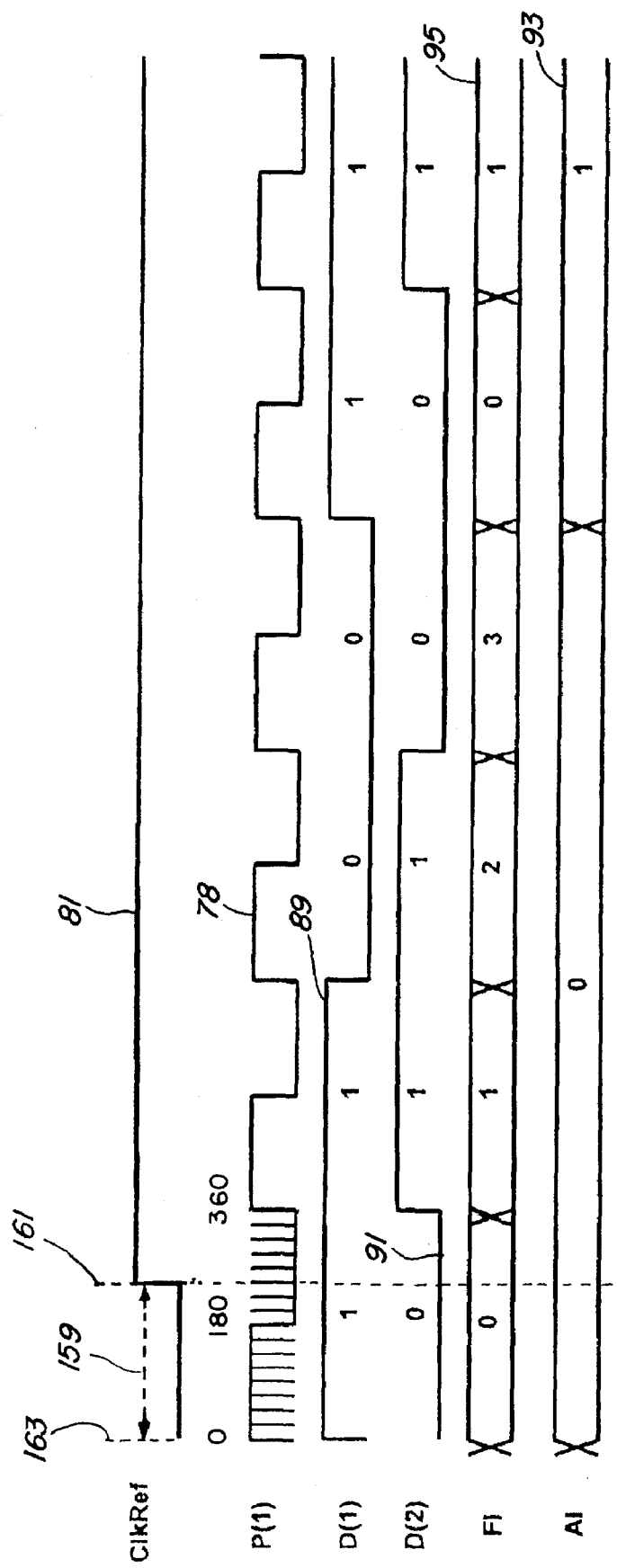
FIG. 15 is a plurality of pulse sequences in the embodiment of FIG. 1.

The fast count unit 37 receives the digital phase indicating signal 91 (D2) from the D flip-flop 35, the digital phase indicating signal 89 (D1) from the D flip-flop 33, along with one of the multiphase signals 78 (P1) from the multiphase oscillator 27 and generates a fast count signal 95 (FI of FIG. 15). If the divide by N circuit 9 is a divide by 4 circuit, then the fast count signal 95 would have a value of 0, 1, 2, 3, and repeat continuously. Every value of the fast count signal 95 (FI) represents the time the traveling wave in the multiphase oscillator 27 has rotated 360 degrees. Each time one of the multiphase signals 78 (P1) from the oscillator 27 switches from "0" to "1," or "1" to "0," the traveling wave has completed 180 degrees. When one of the multiphase signals 78 (P1) switches from "0" to "1" and back to "0," or from "1" to "0" and back to "1," the traveling wave has completed 360 degrees. The fast count signal 95 (FI) is incremented when the traveling wave of the multiphase oscillator 27 has completed 360 degrees.

When the traveling wave of the multiphase oscillator 27 has rotated 450 degrees, the fast count signal 95 (FI) would be 1, since the quotient of 450/360 is 1. When the traveling wave of the multiphase oscillator 27 has rotated 900 degrees, then the fast count signal 95 (FI) would be 2, since 900/360 has a quotient of 2. When the traveling wave of the multiphase oscillator has rotated 1620 degrees, the fast count signal would be 0, since 1620/360 has a quotient of 4.

The accumulator 39 receives and accumulates the digital phase indicating signals 89 (D1) from the D flip-flop 33 in the divide by N circuit 9 to generate an accumulator signal 93 (AI of FIG. 15). The accumulator signal 93 (AI of FIG. 15) is incremented once every time the digital phase indicating signal 89 (D1) rises. Thus, the accumulator signal 93 is incremented for every Nth time the traveling wave of the multiphase oscillator 27 has completed 360 degrees. When the traveling wave of the multiphase oscillator 27 has rotated 450 degrees, for example, the fast count signal 95 (FI) will be 1 and the accumulator signal 93 (AI) will be 0. When the traveling wave of the multiphase oscillator 27 has traversed 900 degrees, the fast count signal 95 (FI) will be 2, and the accumulator signal 93 (AI) will be 0. When the traveling wave of the multiphase oscillator has rotated 1620 degrees, the fast count signal (FI) will be 0, and the accumulator signal 93 (AI) will be 1. The accumulator signal 93 (AI) is sent to the re-clock unit 79.

The re-clock unit 79 receives the fractional phase signal 83, one of the multiphase signals 78, the fast count signal 95, and the accumulator signal 93, and generates a total phase signal 43. The total phase signal 43 is calculated according to the formula:

$$[(AI \times N) + FI] \times 360 + Frac$$

Where AI is the accumulator signal 93, N is the dividing factor in the divide by N circuit, FI is the fast count signal 95, and Frac is the fractional phase signal 83. The total phase signal 43 and the activation signal 45 are transmitted to the phase detector 11.

FIG. 15 illustrates the pulse signals in the feedback path 7 of FIG. 1. The ClkRef signal corresponds to the reference clock signal 81. P(1) corresponds to the multiphase signal 78 supplied to the divide by N circuit 9. D(1) corresponds to the digital phase indicating signal 89 from flip-flop 33. D(2) corresponds to the digital phase indicating signal 91 from flip flop 35. FI corresponds to the fast count signal 95 from fast count unit 37. AI corresponds to the accumulator signal 93. The signals for P(1) correspond to the output of digital input 99 in the multiphase oscillator 27 (FIG. 1). The period for P(1) corresponds to the time period that it takes for the traveling wave of the multiphase oscillator 27 to rotate 360 degrees. That is, the P(1) signal switches between "1" and "0" at each 180 degrees of the traveling wave in the multiphase oscillator 27. The signal switches between "0" and "1" at each 360 degrees of the traveling wave in the multiphase oscillator 27.

The time when the signal for P(1) starts is indicated by timeline 163. The reference clock ClkRef rises at timeline 161. A differential time period 159 therefore exists between the reference clock ClkRef rise at time 161 and the starting time for the P(1) digital input of the multiphase oscillator 27 at time 163. This time period 159 corresponds to the fractional phase signal 83 sent by the direction and phase determination unit 29 to the re-clock unit 79.

The value of FI is determined by the D(1) and D(2) flip-flops 33 and 35. The value of FI which represents each 360° rotations of the travelling wave is stored in a look-up table in the fast count unit 37.

Figure 16:
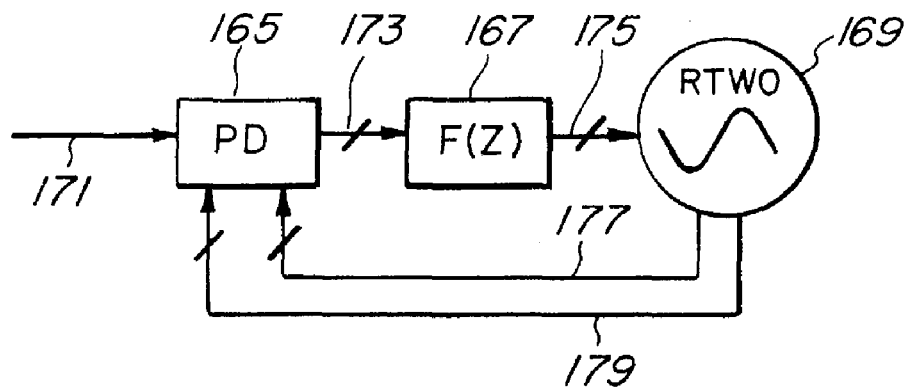
FIG. 16 is a block diagram of a phase lock loop.

FIG. 16 shows a simplified block diagram of a phase lock loop using a multiphase oscillator within which the present invention could be used. The phase lock loop includes a phase detector 165, a filter 167, and a multiphase oscillator 169. The phase detector 165 receives a reference phase signal 171, M-bit integer phase signal 179, and an N-bit fractional phase signal 177 to generate a control signal 173 which is transmitted to the filter 167. The filter 167 averages the signal 173 to generate a filtered signal 175 which is transmitted to the multiphase oscillator 169. The multiphase oscillator 169 then generates an N-bit fractional phase signal 177 and an M-bit integer phase signal 179 which are transmitted to the phase detector 165. The N-bit fractional phase signal 177 mirrors the fractional signal 83 disclosed above. The M-bit integer phase signal 179 can be calculated, for example, using the formula AI×4+FI. The M-bit integer phase signal 179 is multiplied by 360 and the result is added to the N-bit fractional phase signal to produce a total phase signal. The total phase signal is then compared with the reference phase signal 171 to generate the control signal 173.

Figure 17:
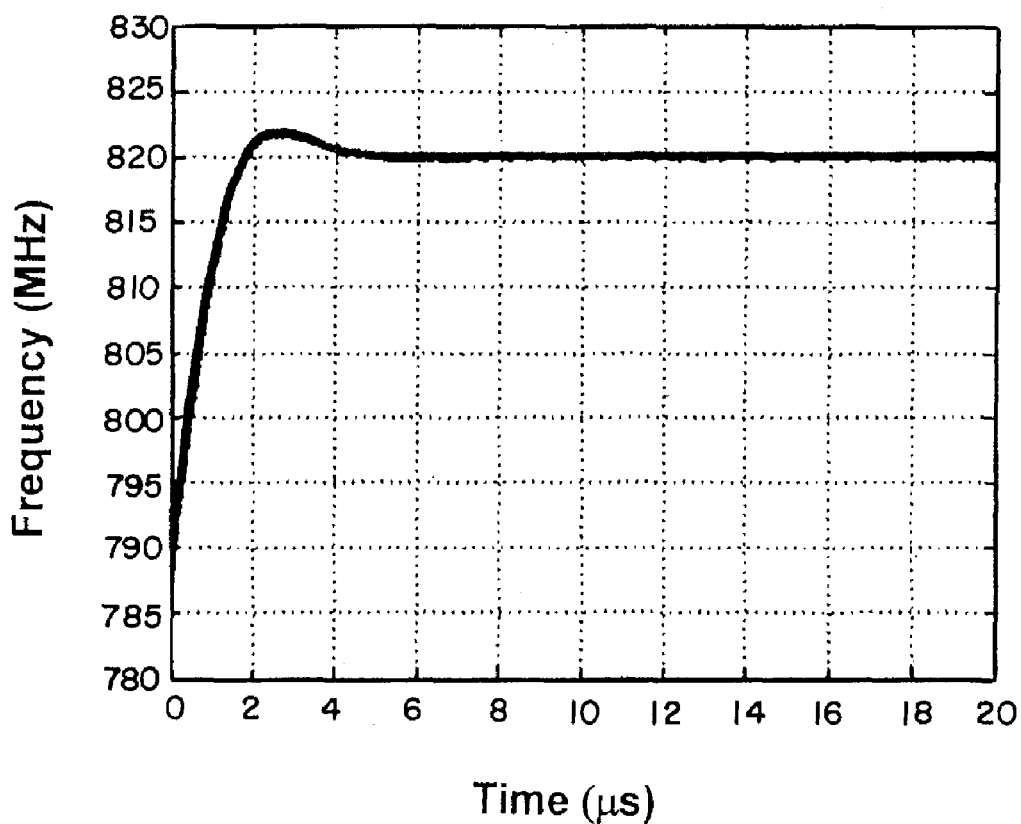
FIG. 17 is a frequency chart over time of the phase lock loop of the present invention in operation.

FIG. 17, shows the frequency response of a phase lock loop according to the present invention, operating with a carrier frequency set to 820 MHz, voltage controlled oscillator ("VCO") sensitivity set with Kv equal to 30 MHz/V, and the reference clock signal set to 50 MHz. As seen from the graph, phase correction is performed within microseconds and the circuit remains phase locked thereafter.

What is claimed is:

1. A phase lock loop comprising:
    a phase detector for generating a control signal indicating a difference between a reference phase signal and a feedback phase signal;
    a rotary traveling wave oscillator (RTWO) responsive to the control signal for generating a plurality of multiphase signals; and
    a fractional phase look-up table responsive to the plurality of multiphase signals for generating a first digital phase indicating signal including a first look-up table for a clockwise rotating wave in the RTWO and a second look-up table for a counterclockwise rotating wave in the RTWO.

2. The phase lock loop of claim 1 further comprising a traveling wave direction determining unit connected to the RTWO for determining whether a traveling wave in the RTWO is traveling in a clockwise or counterclockwise direction.

3. The phase lock loop of claim 2 wherein the traveling wave direction determining unit includes a DQ flip flop receiving two of the plurality of multiphase signals from the RTWO.

4. The phase lock loop of claim 1 further comprising
    a plurality of DQ flip-flops responsive to the control signal from the phase detector, each DQ flip-flop generating a reduced clocked signal at a fraction of the frequency of the control signal.

5. The phase lock loop of claim 4 wherein the RTWO is responsive to the reduced clocked control signals.

6. A phase lock loop comprising:
    a phase detector for generating a control signal indicating a difference between a reference phase signal and a feedback phase signal;
    a rotary traveling wave oscillator (RTWO) responsive to the control signal for generating a plurality of multiphase signals;
    a fractional phase look-up table responsive to the plurality of multiphase signals for generating a first digital phase indicating signal;
    a divide by N circuit receiving one of the plurality of multiphase signals and generating a first digital phase signal and a second digital phase signal; and a fast count unit receiving the first divided digital phase signal and generating a second digital phase indicating signal.

7. The phase lock loop of claim 6 further comprising an accumulator receiving the second divided digital phase signal and generating a third digital phase indicating signal.

8. The phase lock loop of claim 7 further comprising a re-clock unit receiving the first digital phase indicating signal, the second digital phase indicating signal, and the third digital phase indicating signal, and generating the feedback phase signal.

9. A method for locking onto a reference phase comprising the step of:
generating a control signal indicating a difference between a reference phase signal and a feedback phase signal;
generating a plurality of multiphase signals in response to the control signal;
generating a digital phase indicating signal utilizing a fractional phase look-up table responsive to the plurality of multiphase signals and
determining whether a wave in an oscillator is traveling in a clockwise or counterclockwise direction.

10. The method of claim 9 wherein the fractional phase look-up table comprises a first look-up table for a clockwise rotating wave in the oscillator and a second look-up table for a counterclockwise rotating wave in the oscillator.

11. A phase lock loop comprising:
a phase detector for generating a control signal indicating the difference between a reference phase signal and a feedback phase signal;
a plurality of DQ flip-flops responsive to the control signal, each DQ flip-flop generating a clock signal at a fraction of the frequency of the control signal; and
a multiphase oscillator responsive to the reduced frequency clock signals for generating a plurality of multiphase signals that are used to provide a first digital phase indicating signal.

12. The phase lock loop of claim 11 wherein the multiphase oscillator is a RTWO.

13. The phase lock loop of claim 12 wherein the RTWO includes a plurality of capacitors, each of the plurality of capacitors being activated by one of the plurality of DQ flip-flops at a zero crossing of the traveling wave in the RTWO.

14. The phase lock loop of claim 13 further comprising a serial to parallel unit receiving the control signal from the phase detector and generating a plurality of reduced frequency signals, each of the plurality of reduced frequency signals being transmitted to one of the plurality of DQ flip-flops.

15. The phase lock loop of claim 12 further comprising a fractional phase look-up table including a first look-up table for a clockwise rotating wave in the RTWO and a second look-up table for a counterclockwise rotating wave in the RTWO, the fractional phase look-up table responsive to the plurality of multiphase signals for generating the first digital phase indicating signal.

16. The phase lock loop of claim 13 further comprising a traveling wave direction determining unit connected to the RTWO for determining whether the traveling wave in the RTWO is rotating in a clockwise or counterclockwise direction.

17. The phase lock loop of claim 12 further comprising a divide by N circuit receiving one of the plurality of multiphase signals from the RTWO and generating a first digital phase signal and a second digital phase signal.

18. The phase lock loop of claim 17 further comprising:
a fast count unit receiving the first digital phase signal and generating a second digital phase indicating signal;
an accumulator receiving the second digital phase signal and generating a third digital phase indicating signal; and
a re-clock unit receiving the first digital phase indicating signal, the second digital phase indicating signal, and the third digital phase indicating signal to generate the feedback phase signal.

19. The phase lock loop of claim 12 further comprising:
a frequency divider receiving an output signal from the RTWO and frequency dividing the output signal to generate a frequency divided signal; and
a multiplexer receiving the output signal from the RTWO and the frequency divided signal and selecting either the output signal or the frequency divided signal.

20. A phase lock loop comprising:
a phase detector for generating a control signal indicating the difference between a reference phase signal and a fractional phase signal;
a multiphase rotary traveling wave oscillator (RWTO) responsive to the control signal for generating a plurality of multiphase signals, the plurality of multiphase signals being used to generate a first digital phase indicating signal;
a divide by N circuit receiving one of the plurality of multiphase signals from the oscillator and generating a first digital phase signal and a second digital phase signal; and
a fast count unit receiving the first digital phase signal and generating a second digital phase indicating signal.

21. The phase lock loop of claim 20 further comprising:
an accumulator receiving the second digital phase signal and generating a third digital phase indicating signal.

22. The phase lock loop of claim 21 further comprising:
a re-clock unit receiving the first phase indicating signal, the second digital phase indicating signal, and the third digital phase indicating signal to generate a feedback phase signal.

23. The phase lock loop of claim 22 wherein the RTWO includes a plurality of capacitors, each of the plurality of capacitors being activated at zero crossings of the traveling wave in the RTWO.

24. The phase lock loop of claim 23 further comprising a plurality of DQ flip-flops, each of the plurality of DQ flip-flops activating one of the plurality capacitors.

25. The phase lock loop of claim 24 further comprising a serial to parallel unit receiving the control signal from the phase detector and generating the plurality of reduced frequency control signals in parallel for activating the plurality of DQ flip-flops.

26. A phase to digital converter comprising:
a rotary traveling wave oscillator (RTWO) generating a plurality of multiphase signals;
a fractional phase look-up table responsive to the plurality of multiphase signals for generating a digital phase indicating signal;
a divide by N circuit receiving one of the plurality of multiphase signals from the RTWO and generating a first digital phase signal and a second digital phase signal; and
a fast count unit receiving the first digital phase signal, the second digital phase signal, and a multiphase signal from the RTWO, and generating a digital phase indicating signal for each 360° multiphase signal from the RTWO.

27. The phase to digital converter of claim 26 further comprising an accumulator receiving the second digital phase signal and generating a digital phase indicating signal for each Nth 360° multiphase signal from the RTWO.

28. The phase to digital converter of claim 26 wherein the fractional phase look-up table comprises a first look-up table for a clockwise rotating wave in the RTWO and a second look-up table for a counterclockwise rotating wave in the RTWO.

29. The phase to digital converter of claim 26 further comprising a traveling wave direction determining unit connected to the RTWO for determining whether a traveling wave in the RTWO is traveling in a clockwise or counterclockwise direction.

30. The phase to digital converter of claim 29 wherein the traveling wave direction determining unit includes a DQ flip flop receiving two of the plurality of multiphase signals from the RTWO.

31. A phase to digital converter, comprising:
an oscillator generating a plurality of multiphase signals; and
a fractional phase look-up table responsive to the plurality of multiphase signals for generating a digital phase indicating signal;
a divide by N circuit receiving one of the plurality of multiphase signals from the oscillator and generating a first digital phase signal and a second digital phase signal; and
a fast count unit receiving the first digital phase signal, the second digital phase signal, and a multiphase signal from the oscillator, and generating a digital phase indicating signal for each 360° multiphase signal from the oscillator.

32. The phase to digital converter of claim 31 further comprising an accumulator receiving the second digital phase signal and generating a digital phase indicating signal for each Nth 360° multiphase signal from the oscillator.

* * * * *